US010186580B2

(12) United States Patent
Rachmady et al.

(10) Patent No.: US 10,186,580 B2
(45) Date of Patent: Jan. 22, 2019

(54) SEMICONDUCTOR DEVICE HAVING GERMANIUM ACTIVE LAYER WITH UNDERLYING DIFFUSION BARRIER LAYER

(71) Applicant: Intel Corporation, Santa Clara, CA (US)

(72) Inventors: Willy Rachmady, Beaverton, OR (US); Van H. Le, Portland, OR (US); Ravi Pillarisetty, Portland, OR (US); Jack T. Kavalieros, Portland, OR (US); Robert S. Chau, Beaverton, OR (US); Harold W. Kennel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/433,441

(22) Filed: Feb. 15, 2017

(65) Prior Publication Data

US 2017/0162653 A1    Jun. 8, 2017

Related U.S. Application Data

(62) Division of application No. 13/996,502, filed as application No. PCT/US2011/067241 on Dec. 23, 2011, now Pat. No. 9,608,055.

(51) Int. Cl.
*H01L 29/10*    (2006.01)
*H01L 29/66*    (2006.01)
(Continued)

(52) U.S. Cl.
CPC .......... *H01L 29/1083* (2013.01); *B82Y 10/00* (2013.01); *H01L 21/28255* (2013.01);
(Continued)

(58) Field of Classification Search
CPC ............. H01L 29/0603; H01L 29/0607; H01L 29/78684
See application file for complete search history.

(56) References Cited

U.S. PATENT DOCUMENTS 7,145,167 B1    12/2006    Chu
7,485,536 B2 *  2/2009    Jin ...................... H01L 29/0847
                                                257/E21.043
(Continued)

FOREIGN PATENT DOCUMENTS

CN    1343374    4/2002
CN    101819996    9/2010
(Continued)

OTHER PUBLICATIONS

International Search Report and Written Opinion from PCT/US2011/067241 dated Aug. 1, 2012, 8 pgs.
(Continued)

*Primary Examiner* — Bilkis Jahan
*Assistant Examiner* — Victor Barzykin
(74) *Attorney, Agent, or Firm* — Schwabe, Williamson & Wyatt, P.C.

(57)    ABSTRACT

Semiconductor devices having germanium active layers with underlying diffusion barrier layers are described. For example, a semiconductor device includes a gate electrode stack disposed above a substrate. A germanium active layer is disposed above the substrate, underneath the gate electrode stack. A diffusion barrier layer is disposed above the substrate, below the germanium active layer. A junction leakage suppression layer is disposed above the substrate, below the diffusion barrier layer. Source and drain regions are disposed above the junction leakage suppression layer, on either side of the gate electrode stack.

25 Claims, 11 Drawing Sheets

(51) Int. Cl.

| | | |
|---|---|---|
| *H01L 29/775* | (2006.01) | |
| *H01L 29/778* | (2006.01) | |
| *H01L 29/06* | (2006.01) | |
| *H01L 29/786* | (2006.01) | |
| *H01L 21/28* | (2006.01) | |
| *H01L 29/165* | (2006.01) | |
| *H01L 29/78* | (2006.01) | |
| *B82Y 10/00* | (2011.01) | |
| *H01L 29/423* | (2006.01) | |

(52) U.S. Cl.
CPC ...... *H01L 29/0603* (2013.01); *H01L 29/0607* (2013.01); *H01L 29/0673* (2013.01); *H01L 29/1054* (2013.01); *H01L 29/165* (2013.01); *H01L 29/42392* (2013.01); *H01L 29/66431* (2013.01); *H01L 29/66439* (2013.01); *H01L 29/66795* (2013.01); *H01L 29/775* (2013.01); *H01L 29/7781* (2013.01); *H01L 29/785* (2013.01); *H01L 29/7849* (2013.01); *H01L 29/78603* (2013.01); *H01L 29/78684* (2013.01); *H01L 29/78696* (2013.01); *H01L 29/7853* (2013.01)

(56) References Cited

U.S. PATENT DOCUMENTS

| | | | |
|---|---|---|---|
| 7,491,988 B2 | 2/2009 | Tolchinsky et al. | |
| 7,608,496 B2* | 10/2009 | Chu | H01L 21/823807 |
| | | | 438/172 |
| 8,080,820 B2 | 12/2011 | Pillarisetty et al. | |
| 2005/0285212 A1 | 12/2005 | Tolchinsky et al. | |
| 2007/0072335 A1* | 3/2007 | Baik | B82Y 10/00 |
| | | | 438/99 |
| 2007/0187716 A1* | 8/2007 | Chu | H01L 21/823807 |
| | | | 257/192 |
| 2008/0237573 A1 | 10/2008 | Jin et al. | |
| 2008/0237575 A1* | 10/2008 | Jin | B82Y 10/00 |
| | | | 257/19 |
| 2010/0207208 A1* | 8/2010 | Bedell | B82Y 10/00 |
| | | | 257/346 |
| 2010/0219396 A1* | 9/2010 | Jin | H01L 29/1054 |
| | | | 257/14 |
| 2011/0260173 A1* | 10/2011 | Wang | H01L 29/1054 |
| | | | 257/76 |

FOREIGN PATENT DOCUMENTS

| | | |
|---|---|---|
| WO | WO-00/54338 | 9/2000 |
| WO | WO-2011127727 | 10/2011 |

OTHER PUBLICATIONS

International Preliminary Report on Patentability from PCT/US2011/067241 dated Jul. 3, 2014, 5 pgs.
Office Action and Search Report from Taiwan Patent Application No. 101146397, dated Nov. 26, 2014, 6 pgs.
First Office Action and Search Report from Chinese Patent Application No. 201180075742.5, dated Feb. 29, 2016, 19 pgs.
Office Action and Search Report for Taiwanese Patent Application No. 104126248, dated Apr. 26, 2016, 6 pgs.
Second Office Action from Chinese Patent Application No. 201180075742.5 dated Oct. 31, 2016, 18 pgs.
Third Office Action from Chinese Patent Application No. 201180075742.5 dated Feb. 13, 2017, 10 pgs.
Non-Final Office Action from U.S. Appl. No. 13/996,502 dated Apr. 7, 2016, 13 pgs.
Fourth Office Action from Chinese Patent Application No. 201180075742.5 dated Jun. 2, 2017, 10 pgs., no translation.
Non-Final Office Action for German Patent Application No. 112011106033.5 dated Jun. 2, 2017, 13 pgs., with English translation.

* cited by examiner

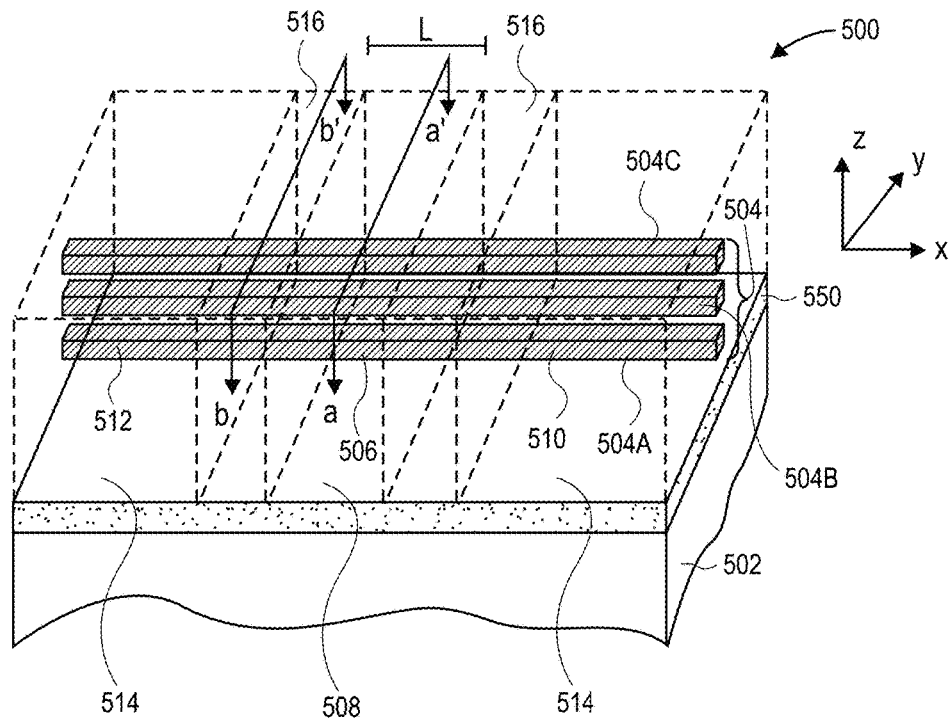
FIG. 5A
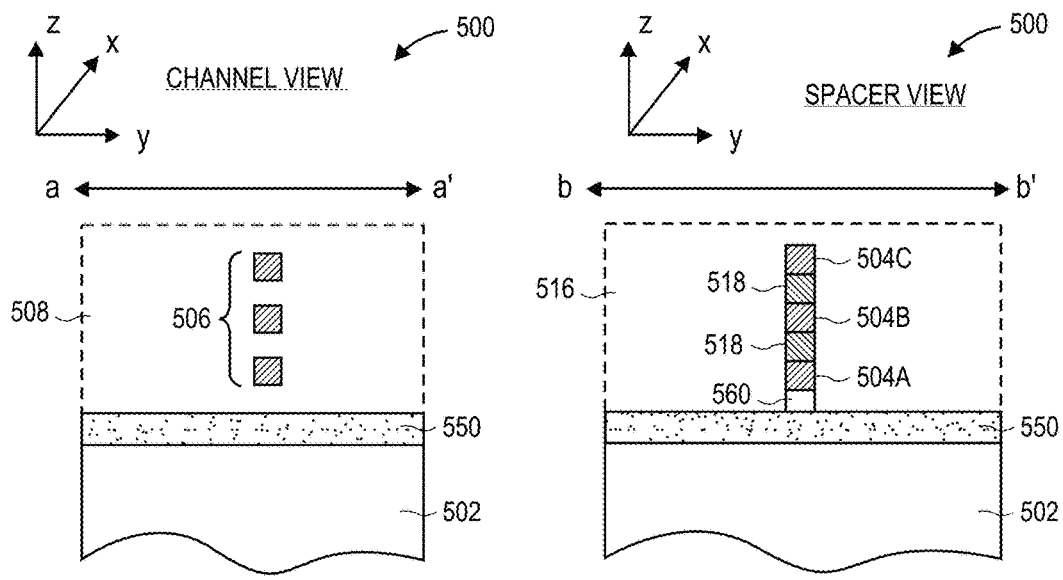
FIG. 5B  FIG. 5C

SEMICONDUCTOR DEVICE HAVING GERMANIUM ACTIVE LAYER WITH UNDERLYING DIFFUSION BARRIER LAYER

CROSS-REFERENCE TO RELATED APPLICATIONS

This application is a divisional of U.S. patent application Ser. No. 13/996,502, filed on Jun. 20, 2013, which is a U.S. National Phase application under 35 U.S.C. § 371 of International Application No. PCT/US2011/067241, filed Dec. 23, 2011, entitled "SEMICONDUCTOR DEVICE HAVING GERMANIUM ACTIVE LAYER WITH UNDERLYING DIFFUSION BARRIER LAYER," the entire contents of which are incorporated herein by reference.

TECHNICAL FIELD

Embodiments of the invention are in the field of semiconductor devices and, in particular, semiconductor devices having germanium active layers with underlying diffusion barrier layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the reduced leakage they can offer.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate capacitance parasitics.

Many different techniques have been attempted to reduce junction leakage of transistors. However, significant improvements are still needed in the area of junction leakage suppression.

SUMMARY

Embodiments of the present invention include semiconductor devices having germanium active layers with underlying diffusion barrier layers.

In an embodiment, a semiconductor device includes a gate electrode stack disposed above a substrate. A germanium active layer is disposed above the substrate, underneath the gate electrode stack. A diffusion barrier layer is disposed above the substrate, below the germanium active layer. A junction leakage suppression layer is disposed above the substrate, below the diffusion barrier layer. Source and drain regions are disposed above the junction leakage suppression layer, on either side of the gate electrode stack.

In another embodiment, a semiconductor device includes a gate electrode stack disposed above a substrate. A three-dimensional germanium active body is disposed above and coupled with the substrate, underneath the gate electrode stack. An isolation region is disposed above the substrate and exposes the three-dimensional germanium active body. A diffusion barrier layer is disposed above the substrate, below the three-dimensional germanium active body. A junction leakage suppression layer is disposed above the substrate, below the diffusion barrier layer. Source and drain regions are disposed above the junction leakage suppression layer, on either side of the gate electrode stack.

In another embodiment, a semiconductor device includes one or more germanium nanowires disposed above a substrate. A junction leakage suppression layer is disposed above the substrate, below the one or more germanium nanowires. A gate electrode stack is disposed on the leakage suppression layer and completely surrounds at least a portion of each of the one or more germanium nanowires. Spacers are disposed adjacent the gate electrode stack. A diffusion barrier layer is disposed on the leakage suppression layer, below the spacers. Source and drain regions are disposed on the junction leakage suppression layer, on either side of the spacers of the gate electrode stack.

BRIEF DESCRIPTION OF THE DRAWINGS

FIG. 5A illustrates a three-dimensional cross-sectional view of a nanowire-based semiconductor structure, in accordance with an embodiment of the present invention.

FIG. 5B illustrates a cross-sectional channel view of the nanowire-based semiconductor structure of FIG. 5A, as taken along the a-a' axis, in accordance with an embodiment of the present invention.

FIG. 5C illustrates a cross-sectional spacer view of the nanowire-based semiconductor structure of FIG. 5A, as taken along the b-b' axis, in accordance with an embodiment of the present invention.

DETAILED DESCRIPTION

Semiconductor devices having germanium active layers with underlying diffusion barrier layers are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are targeted at germanium-on-silicon (Ge-on-Si) substrate arrangements with N-type dopant diffusion barrier layers. Such arrangements may be included to form germanium based transistors such as planar devices, fin or tri-gate based devices, and gate all around devices, including nanowire-based devices. In nanowire-based devices, the N-type dopant diffusion barrier layer is used in fabrication, but may not be included in a finalized structure (or may be included only to a lesser extent such as where incomplete etching of certain regions is performed. Embodiments described herein may be effective for junction isolation in metal-oxide-semiconductor field effect transistors (MOSFETs).

Figure 1A:
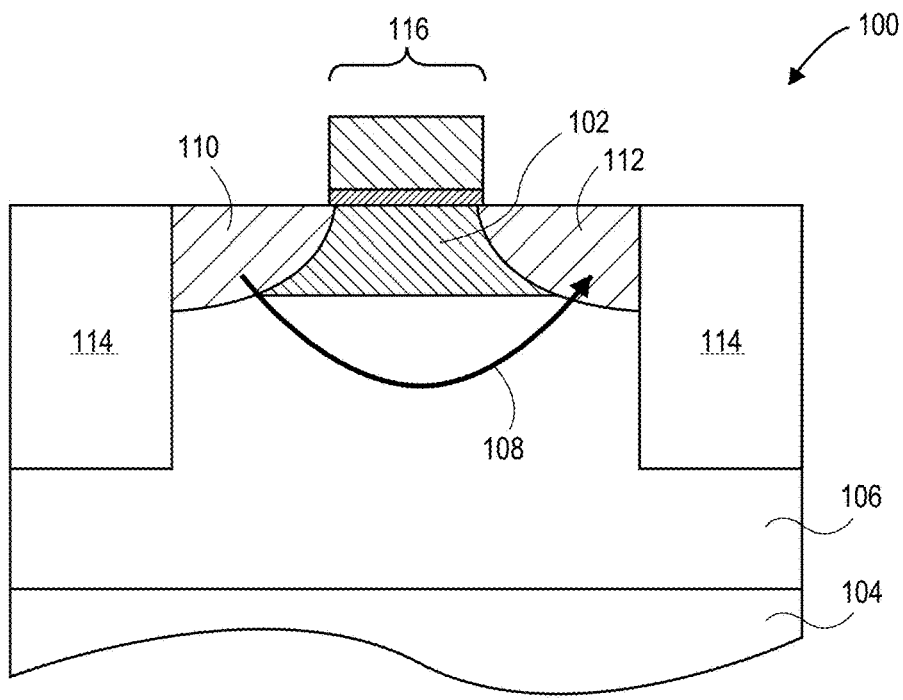
FIGS. 1A and 1B illustrates cross-sectional views of conventional semiconductor devices.
Figure 1B:
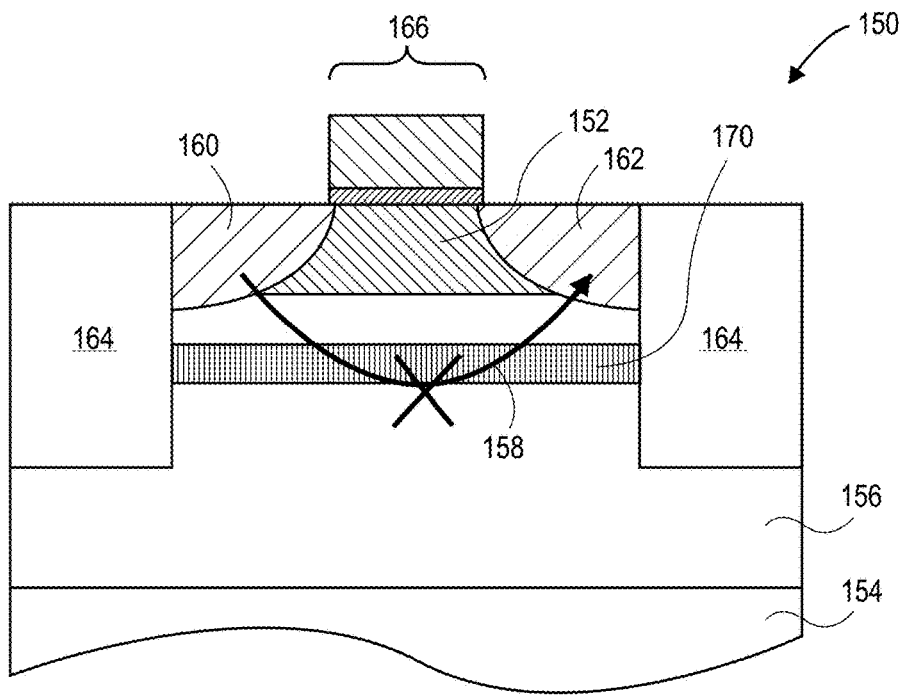

One or more embodiments relate to Ge-on-Si substrate design to control parasitic leakage through a buffer layer. To exemplify the concepts described herein, FIGS. 1A and 1B illustrates cross-sectional views of conventional semiconductor devices. Referring to FIG. 1A, a conventional device 100 includes a germanium (Ge) channel region 102 grown on a silicon (Si) substrate 104 (e.g., as a portion of a silicon wafer) via relaxed silicon germanium (SiGe) buffer layers 106 (e.g., 70% SiGe buffer) to manage lattice mismatch between Ge and Si. These SiGe buffer layers 106 are, however, fairly conductive in that they allow parallel conduction within the region underlying the channel region 102, at least within the SiGe buffer layers 106. The parallel conduction may cause parasitic leakage in the device 100, as depicted by arrow 108, from the source region 110 to the drain region 112. It is noted that FIG. 1A also depicts isolation regions 114 and a gate electrode stack 116, such as a titanium nitride (TiN) gate electrode stack.

Referring to FIG. 1B, one approach to leakage suppression has involved formation of a device such as device 150. Device 150 includes a germanium (Ge) channel region 152 grown on a silicon (Si) substrate 154 (e.g., as a portion of a silicon wafer) via relaxed silicon germanium (SiGe) buffer layers 156 (e.g., 70% SiGe buffer) to manage lattice mismatch between Ge and Si. A phosphorous-doped SiGe layer 170 is incorporated within the upper buffer layer portion 156 to minimize parallel conduction and thereby cut-off the leakage path underneath the active Ge layer 152, as depicted by the blocked arrow 158, from the source region 160 to the drain region 162. It is noted that FIG. 1B also depicts isolation regions 164 and a gate electrode stack 166, such as a titanium nitride (TiN) gate electrode stack.

In light of the above discussion regarding FIGS. 1A and 1B, phosphorous and other N-type doping, such as arsenic, is unfortunately fast diffusing in SiGe and Ge and its diffusivity increases with increasing Ge content in the SiGe. Typically, then, the phosphorous doped SiGe layer is placed well below the Ge layer to prevent N-type dopants from diffusing into the Ge channel layer. Currently, such phosphorous-doped layer is placed about 100 nanometers below the Ge channel to enable device operation. However, such an arrangement still provides a significant amount of conducting SiGe material underneath the Ge channel such that devices with small gate lengths may still exhibit poor short channel effects, e.g., leakage while the device is turned off.

In accordance with an embodiment of the present invention, issues described above are resolved by incorporating a thin Si or relatively low concentration germanium SiGe layer between a phosphorous-doped SiGe layer and a Ge active layer. In one embodiment, the thin Si or relatively low concentration germanium SiGe layer acts as a diffusion barrier for phosphorous (or arsenic) since the diffusion in the lower germanium content layer is slower. In addition, in one embodiment, the diffusion barrier layer is tensily stressed since it is sandwiched by larger lattice constant materials. In a specific such embodiment, the tensily stressed layer enables the resulting multilayer Ge structure to be grown while still maintaining high strain in the films, e.g., to provide compressive stress to the Ge channel layer. Furthermore, in an embodiment, etch selectivity needed in the fabrication of Ge nanowire/nanoribbon devices is enhanced.

Figure 2A:
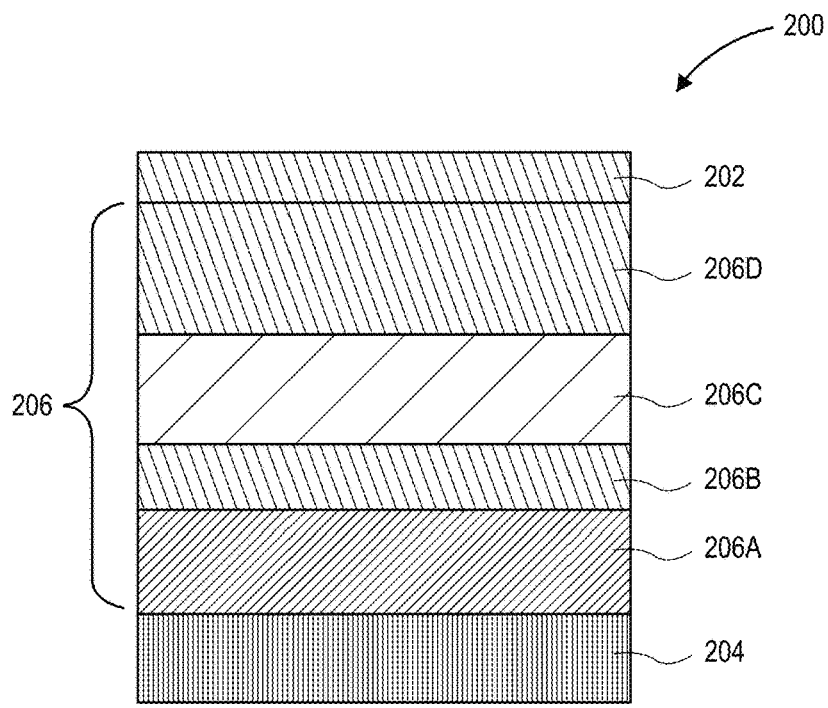
FIG. 2A illustrates a cross-sectional view of a conventional semiconductor layer stack.
Figure 2B:
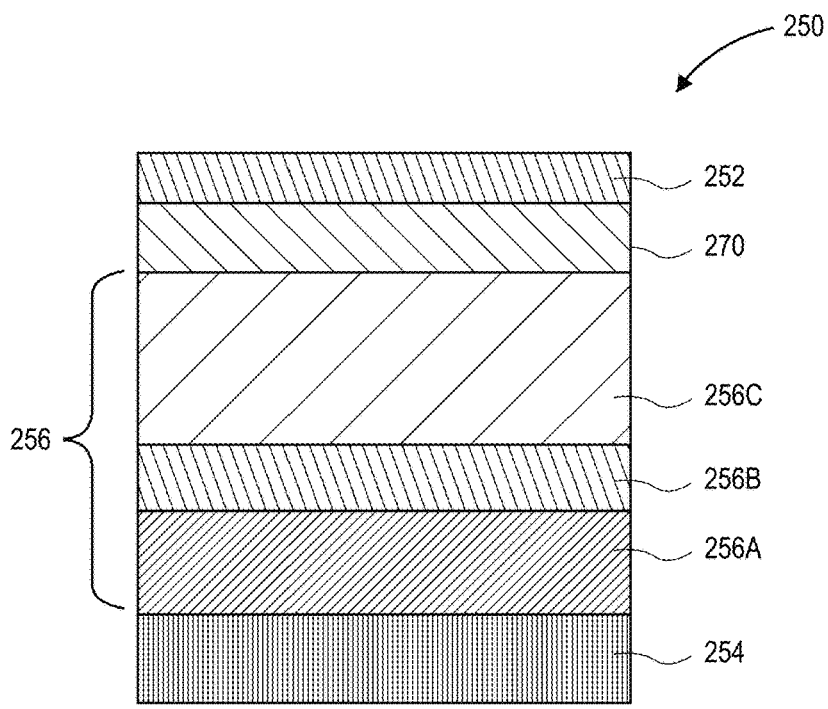
FIG. 2B illustrates a cross-sectional view of another semiconductor layer stack, in accordance with an embodiment of the present invention.

As a comparison of conventional Ge-on-Si substrate design versus designed in accordance with embodiments of the present invention, FIG. 2A illustrates a cross-sectional view of a conventional semiconductor layer stack. FIG. 2B illustrates a cross-sectional view of another semiconductor layer stack, in accordance with an embodiment of the present invention.

Referring to FIG. 2A, a conventional stack 200 includes germanium (Ge) active layer 202 (such as a compressively stressed germanium layer) grown above a silicon (Si) substrate 204 (e.g., as a portion of a silicon wafer) via silicon germanium (SiGe) buffer layers 206 (e.g., layer 206A composed of approximately 0.5-1 micron of $Si_{0.7}Ge_{0.3}$, layer 206B composed of approximately 0.3-1 micron of $Si_{0.3}Ge_{0.7}$, and layer 206D composed of relaxed intrinsic $Si_{0.3}Ge_{0.7}$) to manage lattice mismatch between Ge and Si. A phosphorous-doped SiGe layer 206C (e.g., a layer of relaxed phosphorous doped $Si_{0.3}Ge_{0.7}$) is included between layers 206B and 206D.

Referring to FIG. 2B, in accordance with one or more embodiments of the present invention, a stack 250 includes germanium (Ge) active layer 252 (such as a compressively stressed germanium layer) grown above a silicon (Si) substrate 254 (e.g., as a portion of a silicon wafer) via silicon germanium (SiGe) buffer layers 256 (e.g., layer 256A composed of approximately 0.5-1 micron of $Si_{0.7}Ge_{0.3}$ and layer 256B composed of approximately 0.3-1 micron of $Si_{0.3}Ge_{0.7}$) to manage lattice mismatch between Ge and Si. A phosphorous-doped SiGe layer 256C (e.g., a layer of relaxed phosphorous doped $Si_{0.3}Ge_{0.7}$) is included above layer 256B. However, in place of layer 206D from FIG. 2A, a diffusion barrier layer 270 is included between the phosphorous-doped SiGe layer 256C and the Ge active layer 252, as depicted in FIG. 2B.

In an embodiment, referring again to FIG. 2B, the diffusion barrier layer 270 is composed of silicon germanium having a germanium content less than the germanium content of layer 256C. In one such embodiment, the diffusion barrier layer 270 is composed of silicon germanium having a germanium content at least an order of magnitude less than the germanium content of layer 256C. In another such embodiment, the diffusion barrier layer 270 is composed essentially entirely of silicon. In an embodiment, the diffusion barrier layer 270 is tensily stressed, and the germanium active layer 252 is compressively stressed.

One or more embodiments described herein take advantage of one or more of the following features: (1) a phosphorous or other N-type dopant junction layer to suppress subfin leakage, (2) scaling of a phosphorous junction setback to a germanium channel layer, enabling gate length (Lg) scaling, (3) a low germanium content SiGe or a silicon layer to inhibit or impede N-type dopant diffusion, or (4) a low germanium content SiGe or a silicon layer to enhance wet etch selectivity for Ge nanowire release processes (e.g., by a galvanic coupling effect). In an embodiment, a low germanium content SiGe or a silicon layer may be integrated with a conventional planar or a tri-gate device. Embodiments described herein may also find application with nanowire and nanoribbon devices.

Figure 3A:
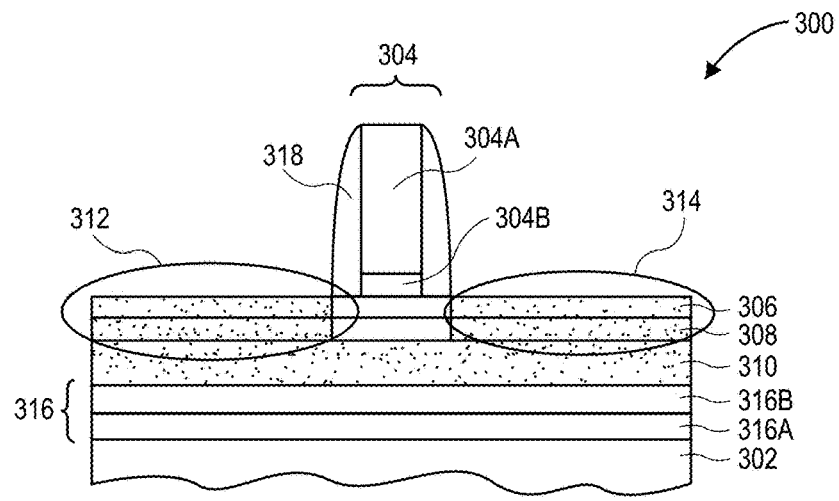
FIG. 3A illustrates a cross-sectional view of a semiconductor device having a germanium active layer with an underlying diffusion barrier layer, in accordance with an embodiment of the present invention.

As an example, FIG. 3A illustrates a cross-sectional view of a semiconductor device having a germanium active layer with an underlying diffusion barrier layer, in accordance with an embodiment of the present invention. Referring to FIG. 3A, a semiconductor device 300 includes a gate electrode stack 304 disposed above a substrate 302. A germanium active layer 306 is disposed above the substrate 302, underneath the gate electrode stack 304. A diffusion barrier layer 308 is disposed above the substrate 302, below the germanium active layer 306. A junction leakage suppression layer 310 is disposed above the substrate 302, below the diffusion barrier layer 308. Source 312 and drain 314 regions are disposed above the junction leakage suppression layer 310, on either side of the gate electrode stack 304.

In an embodiment, the gate electrode stack 304 is disposed directly on the germanium active layer 306, the germanium active layer 306 is disposed directly on the diffusion barrier layer 308, the diffusion barrier layer 308 is disposed directly on the junction leakage suppression layer 310, and the source 312 and drain regions 314 are disposed directly on the junction leakage suppression layer 310, as depicted in FIG. 3A. In one such embodiment, the thickness of the germanium active layer 306 is approximately in the range of 10-500 Angstroms, and the thickness of the diffusion barrier layer 308 is approximately in the range of 5-500 Angstroms. In an embodiment, the semiconductor device 300 further includes a grading stack 316 disposed directly between the substrate 302 and the junction leakage suppression layer 310. In one such embodiment, the grading stack 316 is composed of two layers 316A and 316B (as depicted in FIG. 3A), e.g., a layer 316A composed of approximately 0.5-1 micron of $Si_{0.7}Ge_{0.3}$ and layer 316B composed of approximately 0.3-1 micron of $Si_{0.3}Ge_{0.7}$.

In an embodiment, the germanium active layer 306 is composed essentially of germanium, and the junction leakage suppression layer 310 is composed of phosphorous doped silicon germanium having a germanium to silicon ratio $Si_{1-y}Ge_y$. In one such embodiment, the phosphorous concentration is approximately in the range of 1e17-1e19 atoms/cm$^3$. In one embodiment, y is approximately 0.7. In one embodiment, arsenic dopant atoms, or some other N-type dopant atoms, are used in place of phosphorous dopant atoms. In an embodiment, the device 300 is a PMOS device.

In an embodiment, the diffusion barrier layer 308 is composed of silicon germanium having a germanium to silicon ratio $Si_{1-x}Ge_x$, where x is less than y. In one such embodiment, the diffusion barrier layer is composed of silicon germanium having a germanium to silicon ratio $Si_{1-x}Ge_x$, where x is at least an order of magnitude less than y. In another embodiment, the diffusion barrier layer 308 is composed essentially of silicon. In an embodiment, the diffusion barrier layer 308 is undoped or is lightly doped, but generally not directly doped.

In an embodiment, the diffusion barrier layer 308 impedes diffusion of phosphorous from the junction leakage suppression layer 310 to the germanium active layer 306. In an embodiment, as the composition of the diffusion barrier layer 308 is more heavily weighted with silicon, the thinner the layer may be for diffusion inhibition of dopants from the junction leakage suppression layer 310. In an embodiment, the diffusion barrier layer 308 is tensily stressed, and the germanium active layer 306 is compressively stressed.

Semiconductor device 300 may be any semiconductor device incorporating a gate, a channel region and a pair of source/drain regions. In an embodiment, semiconductor device 300 is one such as, but not limited to, a MOS-FET or a Microelectromechanical System (MEMS). In one embodiment, semiconductor device 300 is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit.

Substrate 302 may be composed of a semiconductor material that can withstand a manufacturing process and in which charge can migrate. In an embodiment, the substrate 302 is a bulk substrate, such as a P-type silicon substrate as is commonly used in the semiconductor industry. In an embodiment, substrate 302 is composed of a crystalline silicon, silicon/germanium or germanium layer doped with a charge carrier, such as but not limited to phosphorus, arsenic, boron or a combination thereof. In one embodiment, the concentration of silicon atoms in substrate 302 is greater than 97% or, alternatively, the concentration of dopant atoms is less than 1%. In another embodiment, substrate 302 is composed of an epitaxial layer grown atop a distinct crystalline substrate, e.g. a silicon epitaxial layer grown atop a boron-doped bulk silicon mono-crystalline substrate.

Substrate 302 may also include an insulating layer disposed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. Substrate 302 may alternatively be composed of a group III-V material. In an embodiment, substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In another embodiment, substrate 302 is composed of a III-V material and charge-carrier dopant impurity atoms such as, but not limited to, carbon, silicon, germanium, oxygen, sulfur, selenium or tellurium.

In an embodiment, the semiconductor device 300 is a planar device and the gate electrode stack 304 is disposed on only a single surface of the germanium active layer 306. In another embodiment, however, the semiconductor device 300 is a non-planar device such as, but not limited to, a fin-FET or a tri-gate device. In such an embodiment, the germanium active layer 306 is composed of or is formed in a three-dimensional body. In one such embodiment, the gate electrode stack 304 surrounds at least a top surface and a pair of sidewalls of the three-dimensional body, as described in greater detail below. In another embodiment, the germanium active layer 306 is made to be a discrete three-dimensional body, such as in a nanowire device, as is also described in greater detail below. In one such embodiment, the gate electrode stack 304 completely surrounds the germanium active layer 306.

Gate electrode stack 304 may include a gate electrode 304A and an underlying gate dielectric layer 304B, as shown in FIG. 3A. In an embodiment, the gate electrode of gate electrode stack 304 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the germanium active layer 306. In an embodiment, the gate dielectric layer is comprised of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In an embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode is composed of a P-type material. The gate electrode stack 304 may also include dielectric spacers 318, as depicted in FIG. 3A.

In an embodiment, the source 312 and drain 314 regions are formed by doping portions of the germanium active layer 306 and, possibly, portions of the diffusion barrier layer 308. For example, P-type dopants, such as boron, may be added to form the source 312 and drain 314 regions. However, in another embodiment, the source and drain regions are embedded source and drain regions. For example, FIGS. 3B and 3C illustrate cross-sectional views in the fabrication of another semiconductor device having a germanium active layer with an underlying diffusion barrier layer, in accordance with another embodiment of the present invention.

Figure 3B:
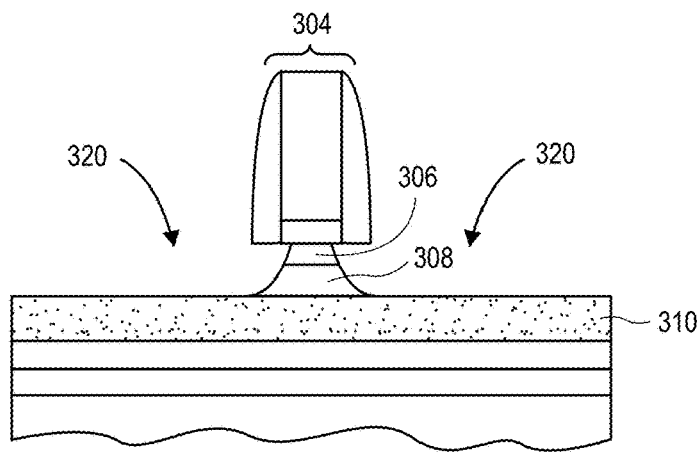
FIGS. 3B and 3C illustrate cross-sectional views in the fabrication of another semiconductor device having a germanium active layer with an underlying diffusion barrier layer, in accordance with another embodiment of the present invention.

Referring to FIG. 3B, portions of the germanium active layer 306 and, possibly, portions of the diffusion barrier layer 308 are removed to provide recessed regions 320, on either side of the gate electrode stack 304. Recessed regions 220 may be formed by any suitable technique that removes portions of the germanium active layer 306 and, possibly, portions of the diffusion barrier layer 308 without detrimentally impacting other semiconductor features that are present, such as a dry etch or a wet etch process. In one embodiment, recessed regions 320 are formed by a dry plasma etch using $NF_3$, HBr, $SF_6$/Cl or $Cl_2$ or a wet etch using $NH_4OH$ or tetramethylammonium hydroxide. In one embodiment, gate electrode stack 304 guides the formation of recessed regions 320, forming self-aligned recessed regions 320. In one embodiment, recessed regions 320 are formed with rounded corners, as shown in FIG. 3B. In another embodiment, however, recessed regions 320 are formed with faceted corners. In an embodiment, portions of the germanium active layer 306 and portions of the diffusion barrier layer 308, using layer 310 as an etch stop layer.

Figure 3C:
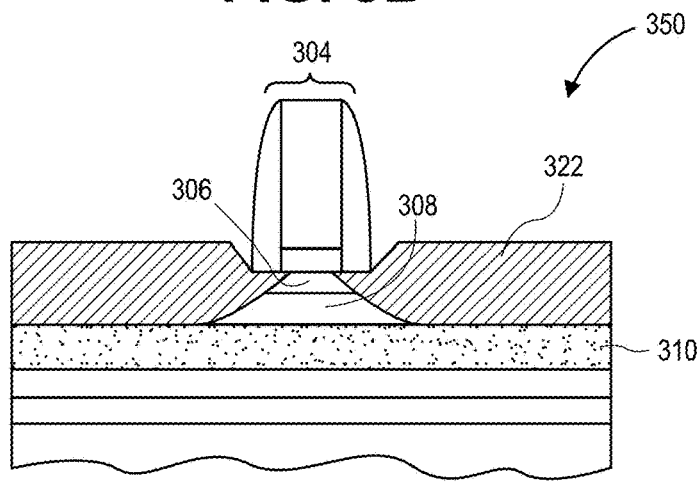

Referring to FIG. 3C, a pair of embedded semiconducting regions 322 is formed in the recessed regions 320, e.g., epitaxially formed on either side of the gate electrode stack 304. In an embodiment, the pair of semiconducting regions 322 is uniaxially compressively stressing for the germanium active layer 306 and is composed of a material having a lattice constant larger than germanium, such as III-V materials having a lattice constant larger than germanium. In one such embodiment, the semiconductor device 350 ultimately formed is a P-type semiconductor device. In an embodiment, the pair of semiconducting regions 322 is formed directly on layer 310, as depicted in FIG. 3C.

Figure 4A:
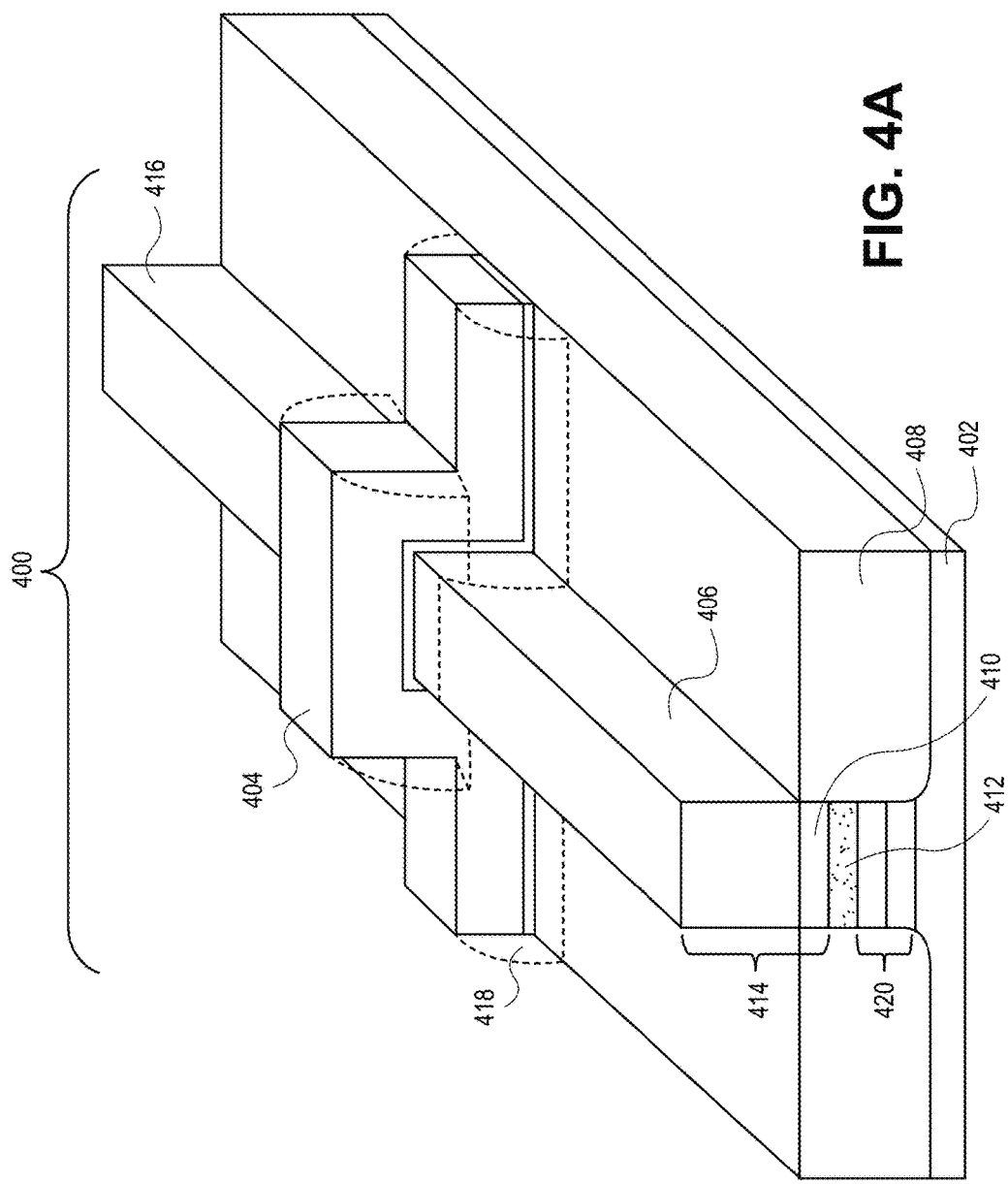
FIGS. 4A-4C illustrate angled views representing various operations in a method of fabricating various semiconductor devices with a three-dimensional body, in accordance with embodiments of the present invention.
Figure 4B:
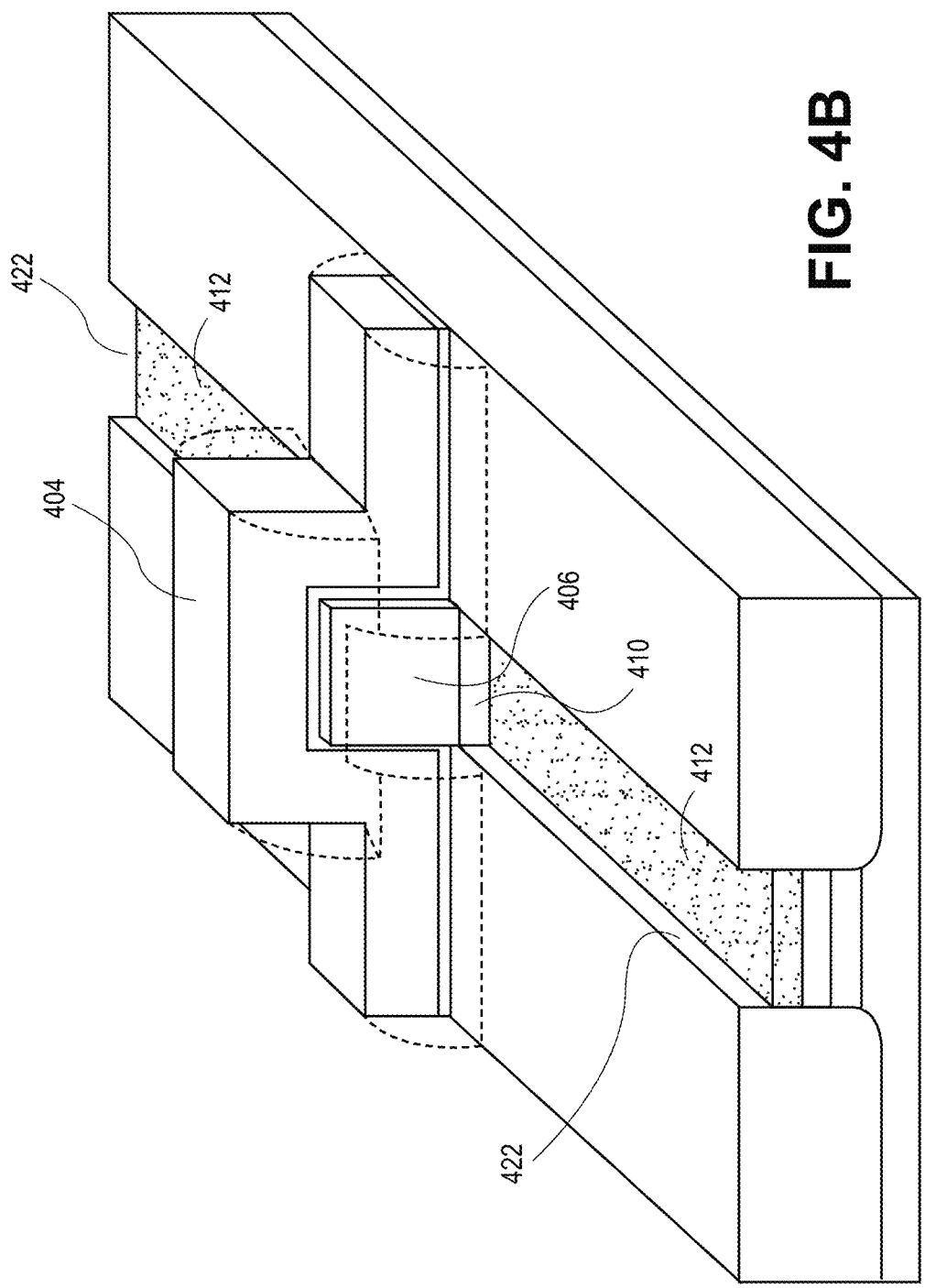
Figure 4C:
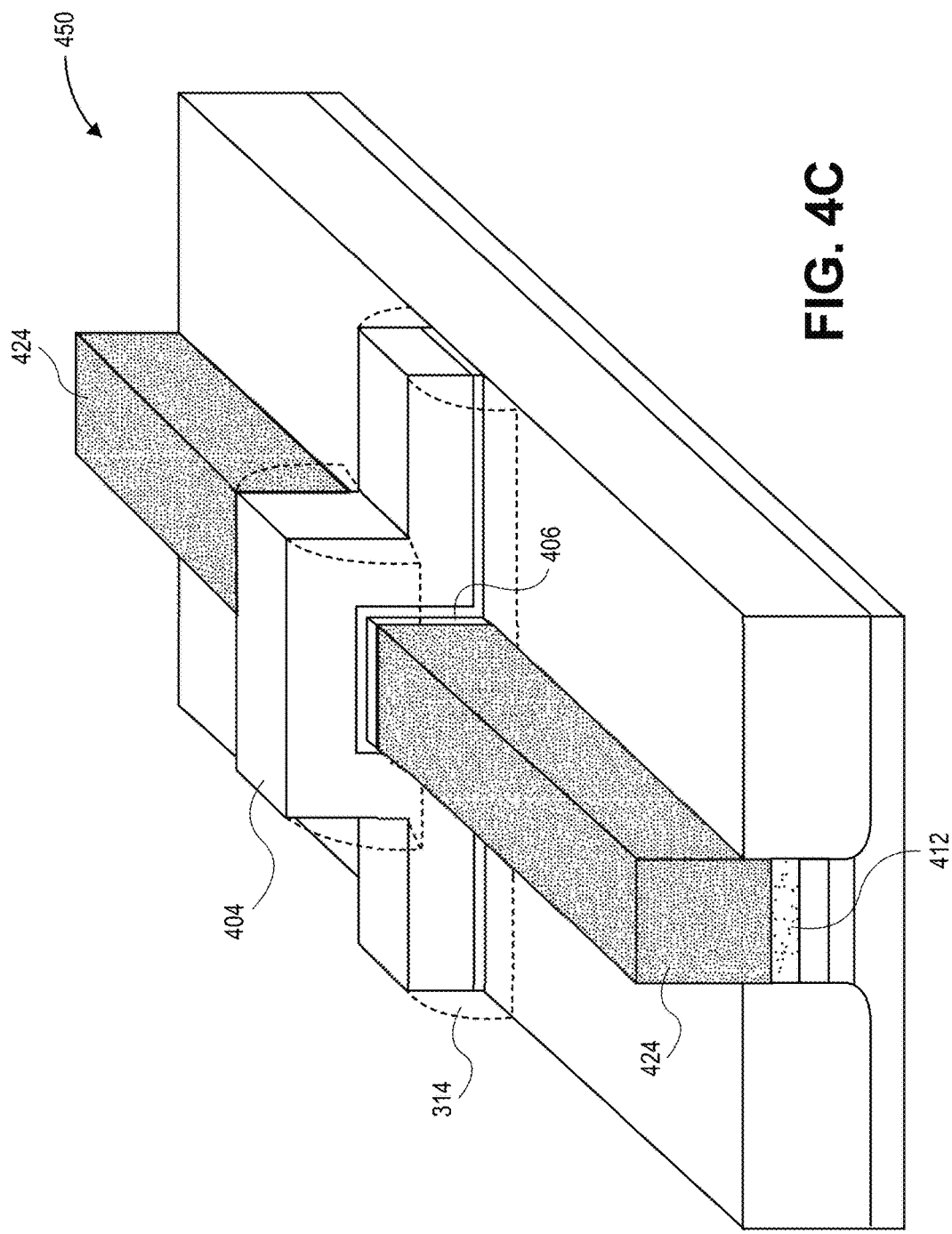

As mentioned above, embodiments of the present invention may be applied to non-planar MOS-FETs. For example, devices with a three-dimensional architecture, such as tri-gate devices, may benefit from the above described process. FIGS. 4A-4C illustrate angled views representing various operations in a method of fabricating various semiconductor devices with a three-dimensional body, in accordance with an embodiment of the present invention.

Referring to FIG. 4A, a semiconductor device 400 includes a gate electrode stack 404 disposed above a substrate 402. A three-dimensional germanium active body 406 is disposed above and coupled with the substrate 402, underneath the gate electrode stack 404. An isolation region 408 is disposed above the substrate 402 and exposes the three-dimensional germanium active body 406. A diffusion barrier layer 410 is disposed above the substrate 402, below the three-dimensional germanium active body 406. A junction leakage suppression layer 412 is disposed above the substrate 402, below the diffusion barrier layer 410. Source 414 and drain regions 416 are disposed above the junction leakage suppression layer, on either side of the gate electrode stack 404. In accordance with an embodiment of the present invention, the isolation regions 408 is set at the interface of the three-dimensional germanium active body 406 and the diffusion barrier layer 410, as depicted in FIG. 4A. However, other embodiments may include setting the height of the isolation regions 408 above or below the interface of the three-dimensional germanium active body 406 and the diffusion barrier layer 410. In an embodiment, the gate electrode stack also includes gate isolation spacers 418, as depicted in FIG. 4A.

In an embodiment, the gate electrode stack 404 is disposed directly on the three-dimensional germanium active body 406, the three-dimensional germanium active body 406 is disposed directly on the diffusion barrier layer 410, the diffusion barrier layer 410 is disposed directly on the junction leakage suppression layer 412, and the source 414 and drain 416 regions are disposed directly on the junction leakage suppression layer 412, as depicted in FIG. 4A. In an embodiment, the semiconductor device 400 further includes a grading stack 420, e.g., formed of two grading layers, disposed directly between the substrate 402 and the junction leakage suppression layer 412, as is also depicted in FIG. 4A. In an embodiment, the device 400 is a PMOS device.

Material compositions and dimensions may be the same or similar as those described for semiconductor device 300.

In an embodiment, the three-dimensional germanium active body 406 is composed essentially of germanium, and the junction leakage suppression layer 412 is composed of phosphorous doped silicon germanium having a germanium to silicon ratio $Si_{1-y}Ge_y$. In one such embodiment, the diffusion barrier layer 410 is composed of silicon germanium having a germanium to silicon ratio $Si_{1-x}Ge_x$, where x is less than y. In a specific such embodiment, the diffusion barrier layer 410 is composed of silicon germanium having a germanium to silicon ratio $Si_{1-x}Ge_x$, where x is at least an order of magnitude less than y. In another embodiment, the diffusion barrier layer 410 is composed essentially of silicon.

In an embodiment, the diffusion barrier layer 410 impedes diffusion of phosphorous from the junction leakage suppression layer 412 to the three-dimensional germanium active body 406. In an embodiment, the diffusion barrier layer 410 is tensily stressed, and the three-dimensional germanium active body 406 is compressively stressed.

In an embodiment, the source 414 and drain 416 regions are formed by doping portions of the three-dimensional germanium active body 406 and, possibly, portions of the diffusion barrier layer 410. For example, P-type dopants, such as boron, may be added to form the source 414 and drain 416 regions. However, in another embodiment, the source and drain regions are embedded source and drain regions. For example, FIGS. 4B and 4C illustrate cross-sectional views in the fabrication of another semiconductor device having a germanium active layer with an underlying diffusion barrier layer, in accordance with another embodiment of the present invention.

Referring to FIG. 4B, portions of the three-dimensional germanium active body 406 and, possibly, portions of the diffusion barrier layer 410 are removed to provide recessed regions 422, on either side of the gate electrode stack 404. Recessed regions 422 may be formed by any suitable technique that removes portions of the three-dimensional germanium active body 406 and, possibly, portions of the diffusion barrier layer 410 without detrimentally impacting other semiconductor features that are present, such as a dry etch or a wet etch process. In one embodiment, recessed regions 422 are formed by a dry plasma etch using $NF_3$, HBr, $SF_6/Cl$ or $Cl_2$ or a wet etch using $NH_4OH$ or tetramethylammonium hydroxide. In one embodiment, gate electrode stack 404 guides the formation of recessed regions 422, forming self-aligned recessed regions 422. In an embodiment, portions of the three-dimensional germanium active body 406 and portions of the diffusion barrier layer 410, using layer 412 as an etch stop layer.

Referring to FIG. 4C, a pair of embedded semiconducting regions 424 is formed in the recessed regions 422, e.g., epitaxially formed on either side of the gate electrode stack 404. In an embodiment, the pair of semiconducting regions 424 is uniaxially compressively stressing for the germanium active layer 406 and is composed of a material having a lattice constant larger than germanium, such as III-V materials having a lattice constant larger than germanium. In one such embodiment, the semiconductor device 450 ultimately formed is a P-type semiconductor device. In an embodiment, the pair of semiconducting regions 424 is formed directly on layer 412, as depicted in FIG. 4C.

In another aspect, FIG. 5A illustrates a three-dimensional cross-sectional view of a nanowire-based semiconductor structure, in accordance with an embodiment of the present invention. FIG. 5B illustrates a cross-sectional channel view of the nanowire-based semiconductor structure of FIG. 5A, as taken along the a-a' axis. FIG. 5C illustrates a cross-sectional spacer view of the nanowire-based semiconductor structure of FIG. 5A, as taken along the b-b' axis.

Referring to FIG. 5A, a semiconductor device 500 includes one or more vertically stacked germanium nanowires (504 set) disposed above a substrate 502. Embodiments herein are targeted at both single wire devices and multiple wire devices. As an example, a three nanowire-based devices having nanowires 504A, 504B and 504C is shown for illustrative purposes. For convenience of description, nanowire 504A is used as an example where description is focused on only one of the nanowires. It is to be understood that where attributes of one nanowire are described, embodiments based on a plurality of nanowires may have the same attributes for each of the nanowires.

Each of the germanium nanowires 504 includes a channel region 506 disposed in the nanowire. The channel region 506 has a length (L). Referring to FIG. 5B, the channel region also has a perimeter orthogonal to the length (L). Referring to both FIGS. 5A and 5B, a gate electrode stack 508 surrounds the entire perimeter of each of the channel regions 506. The gate electrode stack 508 includes a gate electrode along with a gate dielectric layer disposed between the channel region 506 and the gate electrode (not individually shown). The channel region 506 is discrete in that it is completely surrounded by the gate electrode stack 508 without any intervening material such as underlying substrate material or overlying channel fabrication materials. Accordingly, in embodiments having a plurality of nanowires 504, the channel regions 506 of the nanowires are also discrete relative to one another, as depicted in FIG. 5B. A junction leakage suppression layer 550 is disposed above the substrate 502, below the one or more germanium nanowires 504. The gate electrode stack 508 is disposed on the leakage suppression layer 550. Although not depicted, in an embodiment, a grading stack is disposed directly between the substrate 502 and the junction leakage suppression layer 550.

Referring again to FIG. 5A, each of the nanowires 504 also includes source and drain regions 510 and 512 disposed in the nanowire on either side of the channel region 104. The source and drain regions 510/512 are disposed on the junction leakage suppression layer 550. In an embodiment, the source and drain regions 510/512 are embedded source and drain regions, e.g., at least a portion of the nanowires is removed and replaced with a source/drain material region. However, in another embodiment, the source and drain regions 510/512 are composed of portions of the one or more germanium nanowires 504.

A pair of contacts 514 is disposed over the source/drain regions 510/512. In an embodiment, the semiconductor device 500 further includes a pair of spacers 516. The spacers 516 are disposed between the gate electrode stack 508 and the pair of contacts 514. As described above, the channel regions and the source/drain regions are, in at least several embodiments, made to be discrete. However, not all regions of the nanowires 504 need be, or even can be made to be discrete. For example, referring to FIG. 5C, nanowires 504A-504C are not discrete at the location under spacers 516. In one embodiment, the stack of nanowires 504A-504C have intervening semiconductor material 518 there between, such as silicon germanium or silicon intervening between germanium nanowires. In one embodiment, the bottom nanowire 504A is still in contact with a portion 560 of a diffusion barrier layer, e.g., used in fabrication as described below. Thus, in an embodiment, a portion of the plurality of vertically stacked nanowires 504 under one or both of the spacers 516 is non-discrete. The diffusion barrier layer is originally disposed on the leakage suppression layer 550, as described in association with FIGS. 6A-6D.

In an embodiment, the one or more germanium nanowires 504 are composed essentially of germanium, and the junction leakage suppression layer 550 is composed of phosphorous doped silicon germanium having a germanium to silicon ratio $Si_{1-y}Ge_y$. In one such embodiment, whether entirely or partially sacrificial or permanent, the diffusion barrier layer is composed of silicon germanium having a germanium to silicon ratio $Si_{1-x}Ge_x$, where x is less than y. In a specific such embodiment, the diffusion barrier layer is composed of silicon germanium having a germanium to silicon ratio $Si_{1-x}Ge_x$, where x is at least an order of magnitude less than y. In another embodiment, the diffusion barrier layer is composed essentially of silicon. In an embodiment, the diffusion barrier layer is tensily stressed, and the one or more germanium nanowires 504 are compressively stressed.

Although the device 500 described above is for a single device, e.g., a PMOS device, a CMOS architecture may also be formed to include both NMOS and PMOS nanowire-based devices disposed on or above the same substrate. In an embodiment, the nanowires 504 may be sized as wires or ribbons, and may have squared-off or rounded corners. Material compositions and dimensions may be the same or similar as those described for semiconductor devices 300 or 400.

In another aspect, methods of fabricating a nanowire semiconductor structure are provided. For example, FIGS. 6A-6D illustrate three-dimensional cross-sectional views representing various operations in a method of fabricating a nanowire semiconductor device having, at least at one point in the process, a germanium active layer with an underlying diffusion barrier layer, in accordance with an embodiment of the present invention.

Figure 6A:
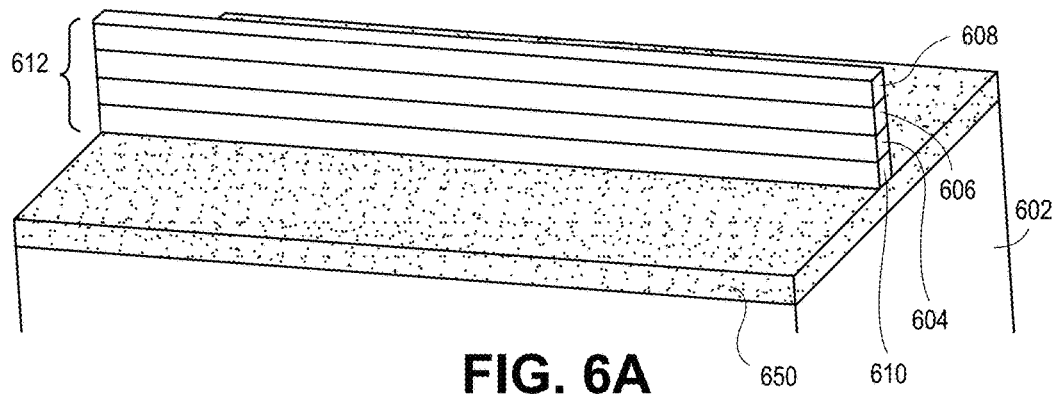
FIGS. 6A-6D illustrate three-dimensional cross-sectional views representing various operations in a method of fabricating a nanowire semiconductor device having, at least at one point in the process, a germanium active layer with an underlying diffusion barrier layer, in accordance with an embodiment of the present invention.

Referring to FIG. 6A, a fin 612 is formed above a substrate 602. The fin includes germanium wire-forming layers 604 and 608 and an intervening material layer 606, such as a silicon or silicon germanium layer. The fin also includes a patterned portion of a diffusion barrier layer 610, such as the diffusion barrier layers described above. The fin is disposed on the leakage suppression layer 650. Although not depicted, in an embodiment, a grading stack is disposed directly between the substrate 602 and the junction leakage suppression layer 650.

Figure 6B:
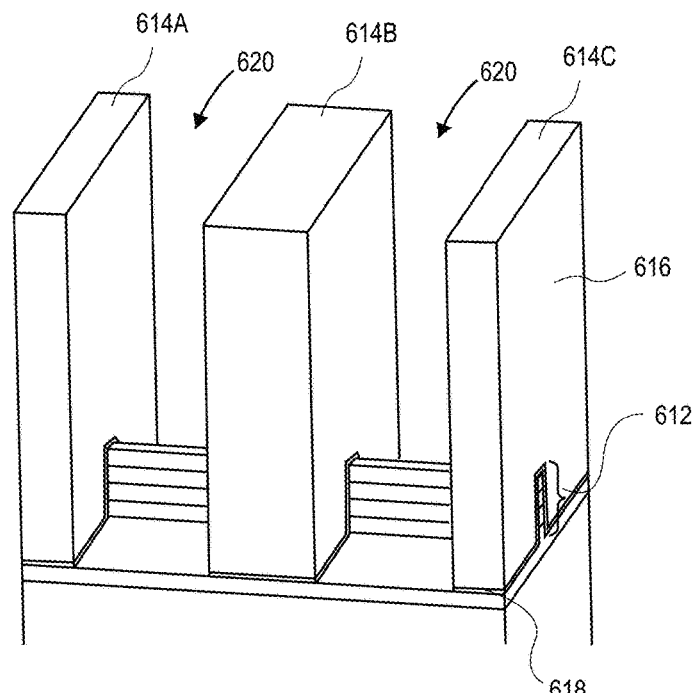

In a specific example showing the formation of three gate structures, FIG. 6B illustrates the fin-type structure 612 with three sacrificial gates 614A, 614B, and 614C disposed thereon. In one such embodiment, the three sacrificial gates 614A, 614B, and 614C are composed of a sacrificial gate oxide layer 616 and a sacrificial polysilicon gate layer 618 which are, e.g., blanket deposited and patterned with a plasma etch process.

Figure 6C:
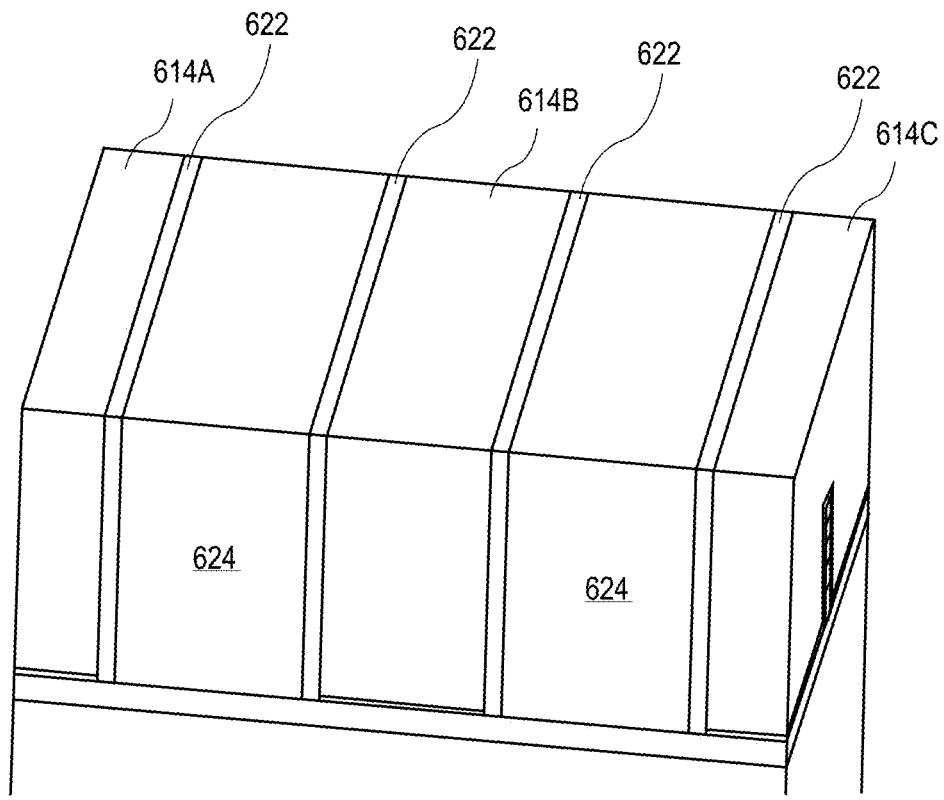

Following patterning to form the three sacrificial gates 614A, 614B, and 614C, spacers may be formed on the sidewalls of the three sacrificial gates 614A, 614B, and 614C, doping may be performed in regions 620 of the fin-type structure 612 shown in FIG. 6B (e.g., tip and/or source and drain type doping), and an interlayer dielectric layer may be formed to cover and then re-expose the three sacrificial gates 614A, 614B, and 614C. The interlayer dielectric layer may then be polished to expose the three sacrificial gates 614A, 614B, and 614C for a replacement gate, or gate-last, process. Referring to FIG. 6C, the three sacrificial gates 614A, 614B, and 614C are exposed, along with spacers 622 and interlayer dielectric layer 624.

Figure 6D:
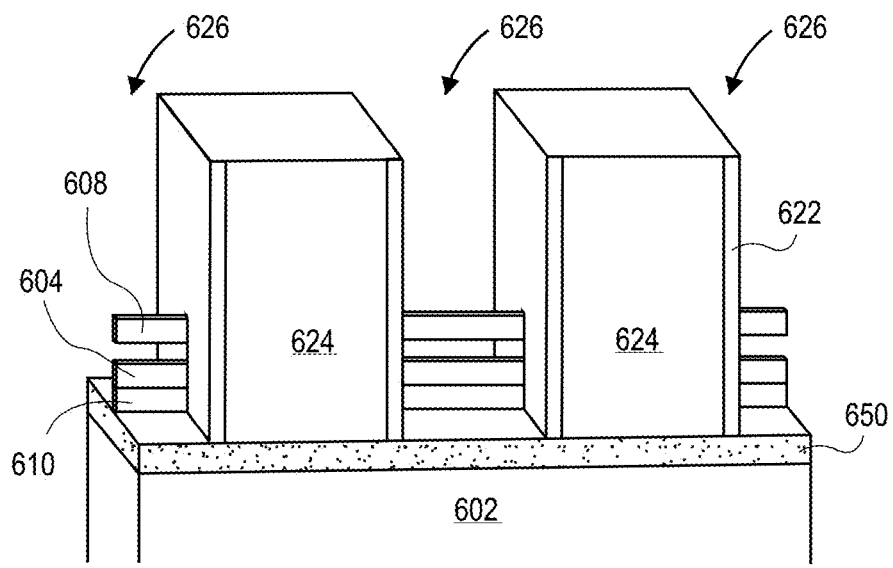

The sacrificial gates 614A, 614B, and 614C may then be removed, e.g., in a replacement gate or gate-last process flow, to expose channel portions of the fin-type structure 612. Referring to FIG. 6D, the sacrificial gates 614A, 614B, and 614C are removed to provide trenches 626 and, thus, reveal channel portions of the nanowires. Portions of the intervening layer 606 exposed by the trenches 626 are removed to leave discrete portions of the germanium layers 604 and 608.

In an embodiment, the silicon-containing layer 606 is etched selectively with a wet etch that selectively removes silicon while not etching the germanium nanowire structures 604 and 608. In an embodiment, although not shown, the diffusion barrier layer 610 may also be removed, e.g., prior to, following, or at the same time as removal of intervening layer 606. Also, the diffusion barrier layer may be totally removed or only partially removed, e.g., leaving remnants under the spacers, or alternatively may be left in tact. In one embodiment, etch selectivity needed in the fabrication of Ge nanowire/nanoribbon devices is enhanced by using a lower germanium content in diffusion barrier layer 610, e.g., through a galvanic coupling effect. Such etch chemistries as aqueous hydroxide chemistries, including ammonium hydroxide and potassium hydroxide, for example, may be utilized to selectively etch the layers 606 and/or 610. Subsequently device fabrication may be completed. In one embodiment, a surrounding gate electrode is formed around the germanium nanowires 604 and 608 and on the suppression layer 650, as described above in association with FIG. 5A.

Thus, the discrete portions of the germanium layers 604 and 608 will, in one embodiment, ultimately become channel regions in a nanowire-based structure. Thus, at the process stage depicted in FIG. 6D, channel engineering or tuning may be performed. For example, in one embodiment, the discrete portions of the germanium layers 604 and 608 are thinned using oxidation and etch processes. Such an etch process may be performed at the same time the wires are separated or individualized. Accordingly, the initial wires formed from germanium layers 604 and 608 may begin thicker and are thinned to a size suitable for a channel region in a nanowire device, independent from the sizing of the source and drain regions of the device.

Following formation of the discrete channel regions as depicted in FIG. 6D, high-k gate dielectric and metal gate processing may be performed and source and drain contacts may be added be added. Contacts may be formed in the place of the interlayer dielectric layer 624 portions remaining in FIG. 6D.

Figure 7:
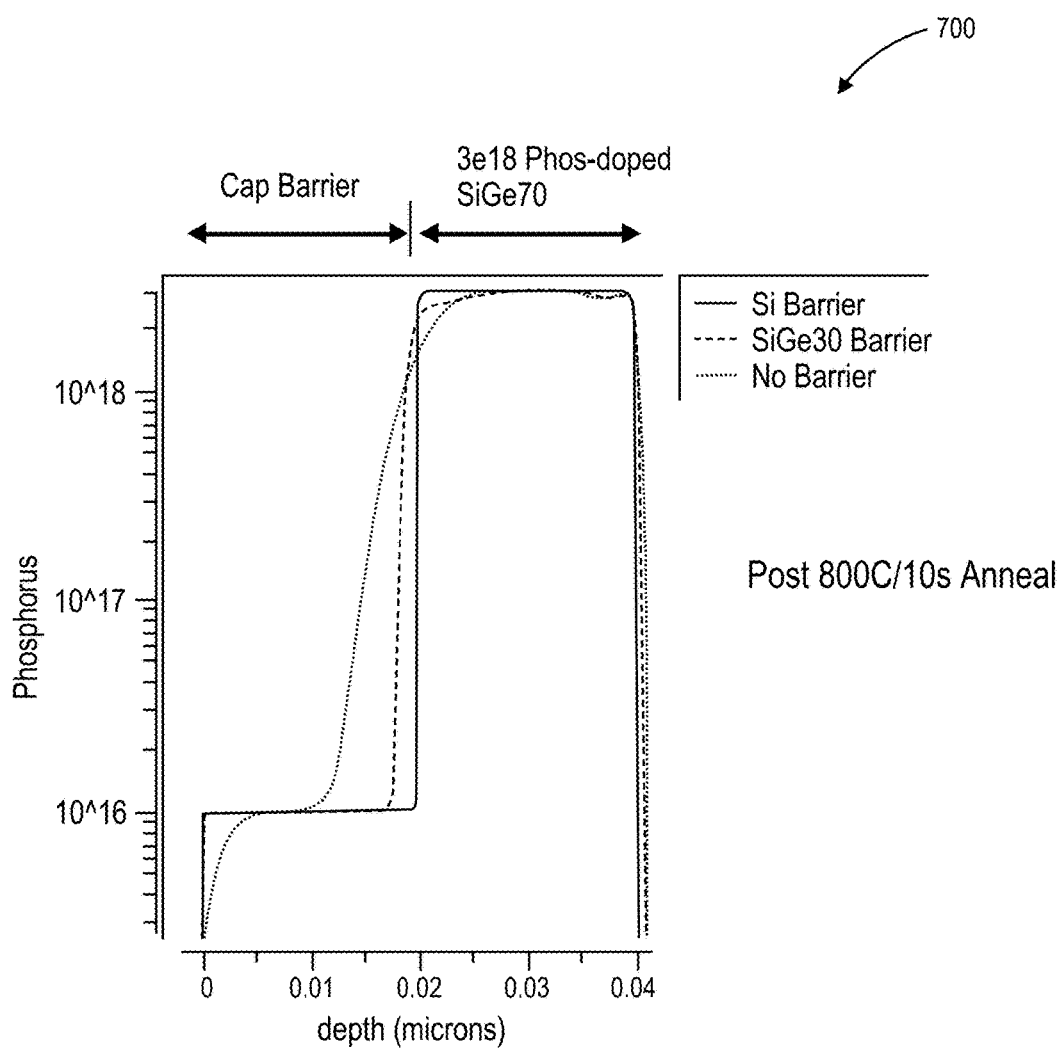
FIG. 7 illustrates a simulation result as a plot of phosphorous concentration depth profile following high temperature anneal, in accordance with an embodiment of the present invention.

With respect to general concepts described above, FIG. 7 illustrates a simulation result as a plot 700 of phosphorous concentration depth profile following high temperature anneal, in accordance with an embodiment of the present invention. Referring top plot 700, the effectiveness of silicon and $Si_{0.7}Ge_{0.3}$ (e.g., silicon rich layers) as barriers to phosphorous diffusion are demonstrated against the diffusion characteristics for germanium rich $Si_{0.3}Ge_{0.7}$.

Figure 8:
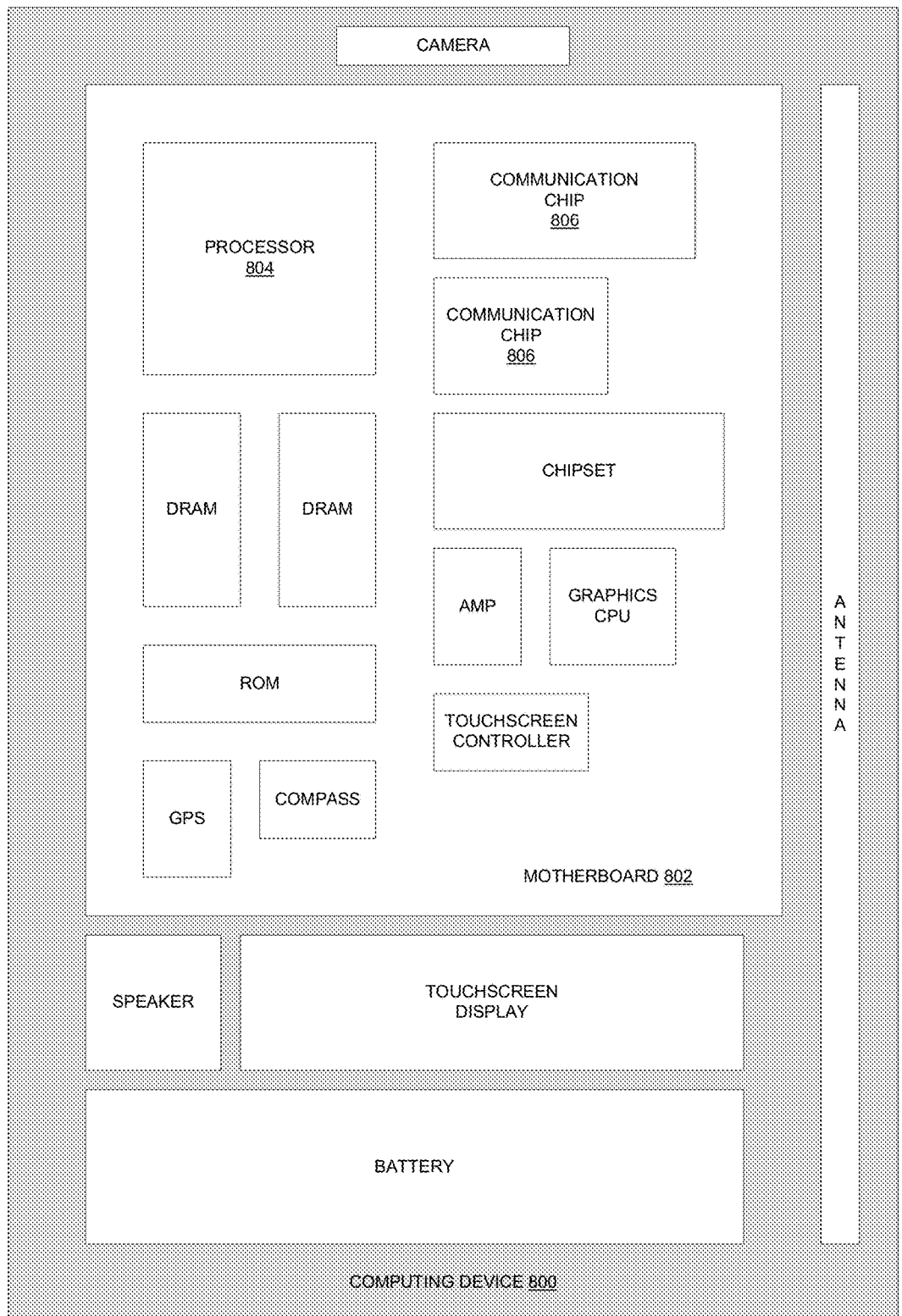
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, semiconductor devices having germanium active layers with underlying diffusion barrier layers have been disclosed. In an embodiment, a semiconductor device includes a gate electrode stack disposed above a substrate. A germanium active layer is disposed above the substrate, underneath the gate electrode stack. A diffusion barrier layer is disposed above the substrate, below the germanium active layer. A junction leakage suppression layer is disposed above the substrate, below the diffusion barrier layer. Source and drain regions are disposed above the junction leakage suppression layer, on either side of the gate electrode stack. In one such embodiment, the gate electrode stack is disposed directly on the germanium active layer, the germanium active layer is disposed directly on the diffusion barrier layer, the diffusion barrier layer is disposed directly on the junction leakage suppression layer, and the source and drain regions are disposed directly on the junction leakage suppression layer.

What is claimed is:

1. A semiconductor device, comprising:
    one or more germanium nanowires disposed above a substrate;
    a junction leakage suppression layer disposed above the substrate, below the one or more germanium nanowires
    a gate electrode stack disposed on the leakage suppression layer and completely surrounding at least a portion of each of the one or more germanium nanowires;
    spacers disposed adjacent the gate electrode stack and over a fin structure comprising one or more layers of germanium and one or more layers of a second different semiconductor material;
    a diffusion barrier layer disposed on the leakage suppression layer, below the spacers; and
    source and drain regions disposed on the junction leakage suppression layer, on either side of the spacers of the gate electrode stack.

2. The semiconductor device of claim 1, wherein the one or more germanium nanowires includes two or more germanium nanowires, the two or more germanium nanowires arranged in a vertically-aligned stack.

3. The semiconductor device of claim 1, further comprising:
    a grading stack disposed directly between the substrate and the junction leakage suppression layer.

4. The semiconductor device of claim 1, wherein the one or more germanium nanowires consist essentially of germanium, and the junction leakage suppression layer comprises phosphorous doped silicon germanium having a germanium to silicon ratio $Si_{1-y}Ge_y$.

5. The semiconductor device of claim 4, wherein the diffusion barrier layer comprises silicon germanium having a germanium to silicon ratio $Si_{1-x}Ge_x$.

6. The semiconductor device of claim 5, wherein the diffusion barrier layer comprises silicon germanium having a germanium to silicon ratio $Si_{1-x}Ge_x$, where x is at least an order of magnitude less than y.

7. The semiconductor device of claim 4, wherein the diffusion barrier layer consists essentially of silicon.

8. The semiconductor device of claim 1, wherein the diffusion barrier layer is tensily stressed, and the one or more germanium nanowires are compressively stressed.

9. The semiconductor device of claim 1, wherein the source and drain regions are embedded source and drain regions.

10. The semiconductor device of claim 9, wherein the embedded source and drain regions are epitaxial source and drain regions comprising a semiconductor material different from the one or more germanium nanowires.

11. The semiconductor device of claim 1, wherein the source and drain regions comprise portions of the one or more germanium nanowires.

12. An integrated circuit structure, comprising:
a plurality of germanium nanowires arranged in a vertically-aligned stack above a substrate;
a junction leakage suppression layer disposed above the substrate, below the plurality of germanium nanowires;
a gate electrode stack disposed on the leakage suppression layer and completely surrounding at least a portion of each of the plurality of germanium nanowires;
a pair of insulating spacers on either side of the gate electrode stack and over a fin structure comprising alternating layers of germanium and a second different semiconductor material; and
source and drain regions disposed on the junction leakage suppression layer, on either side of the pair of insulating spacers.

13. The integrated circuit structure of claim 12, further comprising:
a grading stack disposed directly between the substrate and the junction leakage suppression layer.

14. The integrated circuit structure of claim 12, wherein each of the plurality of germanium nanowires consist essentially of germanium, and the junction leakage suppression layer comprises phosphorous doped silicon germanium having a germanium to silicon ratio $Si_{1-y}Ge_y$.

15. The integrated circuit structure of claim 12, wherein the source and drain regions are embedded source and drain regions.

16. The integrated circuit structure of claim 15, wherein the embedded source and drain regions are epitaxial source and drain regions comprising a semiconductor material different from the plurality of germanium nanowires.

17. The integrated circuit structure of claim 12, wherein the source and drain regions comprise portions of the plurality of germanium nanowires.

18. An integrated circuit structure, comprising:
a germanium nanowire above a substrate;
a junction leakage suppression layer disposed above the substrate, below the germanium nanowire;
a gate electrode stack disposed on the leakage suppression layer and completely surrounding a channel region of the germanium nanowire;
spacers disposed adjacent the gate electrode stack and over a fin structure comprising a layer of germanium and a layer of a second different semiconductor material;
a diffusion barrier layer disposed on the leakage suppression layer, below the spacers; and
source and drain regions disposed on the junction leakage suppression layer, on either side of the spacers of the gate electrode stack.

19. The integrated circuit structure of claim 18, wherein the source and drain regions are embedded source and drain regions.

20. The integrated circuit structure of claim 19, wherein the embedded source and drain regions are epitaxial source and drain regions comprising a semiconductor material different from the germanium nanowire.

21. The integrated circuit structure of claim 18, further comprising:
a grading stack disposed directly between the substrate and the junction leakage suppression layer.

22. The integrated circuit structure of claim 18, wherein the germanium nanowire consists essentially of germanium, and the junction leakage suppression layer comprises phosphorous doped silicon germanium having a germanium to silicon ratio $Si_{1-y}Ge_y$.

23. The integrated circuit structure of claim 22, wherein the diffusion barrier layer comprises silicon germanium having a germanium to silicon ratio $Si_{1-x}Ge_x$, where x is less than y.

24. The semiconductor device of claim 22, wherein the diffusion barrier layer consists essentially of silicon.

25. The integrated circuit structure of claim 18, wherein the diffusion barrier layer is tensily stressed, and the germanium nanowire is compressively stressed.

* * * * *